United States Patent
Rosenberg et al.

(10) Patent No.: US 10,429,556 B2
(45) Date of Patent: Oct. 1, 2019

(54) SPECTRALLY SELECTIVE PANEL (71) Applicant: TROPIGLAS TECHNOLOGIES LTD, Yokine (AU)

(72) Inventors: Victor Rosenberg, Yokine (AU); Mikhail Vasiliev, Quinns Rocks (AU); Kamal Alameh, Rivervale (AU)

(73) Assignee: TROPIGLAS TECHNOLOGIES LTD, Yokine (AU)

( * ) Notice: Subject to any disclaimer, the term of this patent is extended or adjusted under 35 U.S.C. 154(b) by 919 days.

(21) Appl. No.: 14/145,988

(22) Filed: Jan. 1, 2014

(65) Prior Publication Data
US 2014/0182679 A1 Jul. 3, 2014

Related U.S. Application Data (63) Continuation of application No. PCT/AU2012/000778, filed on Jun. 29, 2012.

(30) Foreign Application Priority Data

Jul. 1, 2011 (AU) .............................. 2011902631
Nov. 2, 2011 (AU) .............................. 2011904552
(Continued)

(51) Int. Cl.
*E06B 9/24* (2006.01)
*G02B 5/18* (2006.01)
(Continued)

(52) U.S. Cl.
CPC ........ *G02B 5/282* (2013.01); *B32B 17/10036* (2013.01); *B32B 17/10669* (2013.01);
(Continued)

(58) Field of Classification Search
CPC ...... H01L 31/055; H02S 40/22; G02B 6/0003
See application file for complete search history.

(56) References Cited

U.S. PATENT DOCUMENTS 6,014,845 A   1/2000  Jain et al.
6,285,495 B1  9/2001  Baranov et al.
(Continued)

FOREIGN PATENT DOCUMENTS

EP   2056361      5/2009
JP   2001510902   8/2001
(Continued)

OTHER PUBLICATIONS

Zaban, et al., Langmuir, 1998, 14, pp. 3153-3156.*
(Continued)

*Primary Examiner* — Susan D Leong
*Assistant Examiner* — William E McClain
(74) *Attorney, Agent, or Firm* — Michael Best & Friedrich LLP (57) ABSTRACT

The present invention disclosure provides a spectrally selective panel that comprises a first material being at least partially transmissive for light having a wavelength in the visible wavelength range and being arranged for guiding suitable light. Further, the panel comprises a diffractive element being positioned in, at or in the proximity of the first material. The diffractive element is arranged to deflect predominantly light having a wavelength in an IR wavelength band. The first material is arranged and the diffractive element is oriented such that at least a portion of energy associated with IR light incident from a transversal direction of the spectrally selective panel is directed along the panel towards a side portion of the panel.

18 Claims, 6 Drawing Sheets

(30) Foreign Application Priority Data

Feb. 2, 2012 (AU) .............................. 2012900381
Apr. 24, 2012 (AU) .............................. 2012901618

(51) Int. Cl.
| | |
|---|---|
| *G02B 5/20* | (2006.01) |
| *G02B 5/28* | (2006.01) |
| *B32B 17/10* | (2006.01) |
| *H02S 20/26* | (2014.01) |
| *H02S 40/22* | (2014.01) |
| *H01L 31/054* | (2014.01) |
| *H01L 31/055* | (2014.01) |

(52) U.S. Cl.
CPC .......... *B32B 17/10761* (2013.01); *E06B 9/24* (2013.01); *G02B 5/1814* (2013.01); *G02B 5/208* (2013.01); *H01L 31/055* (2013.01); *H01L 31/0547* (2014.12); *H01L 31/0549* (2014.12); *H02S 20/26* (2014.12); *H02S 40/22* (2014.12); *E06B 2009/2417* (2013.01); *E06B 2009/2476* (2013.01); *Y02B 10/10* (2013.01); *Y02E 10/52* (2013.01)

(56) References Cited

U.S. PATENT DOCUMENTS

| | | | | |
|---|---|---|---|---|
| 6,444,143 | B2* | 9/2002 | Bawendi | 252/301.4 R |
| 7,609,443 | B2* | 10/2009 | Bertin-Mourot | G03B 21/625 359/452 |
| 2004/0095658 | A1* | 5/2004 | Buretea | B82Y 20/00 359/853 |
| 2007/0128449 | A1 | 6/2007 | Taylor et al. | |
| 2008/0223438 | A1 | 9/2008 | Xiang et al. | |
| 2009/0032083 | A1 | 2/2009 | Torrance et al. | |
| 2009/0110356 | A1* | 4/2009 | Xiang | G02B 6/10 385/129 |
| 2009/0229652 | A1* | 9/2009 | Mapel | H01L 31/055 136/246 |
| 2009/0296188 | A1 | 12/2009 | Jain et al. | |
| 2010/0224248 | A1* | 9/2010 | Kenney | H01L 31/055 136/259 |
| 2010/0236625 | A1 | 9/2010 | Kenny et al. | |
| 2011/0126889 | A1* | 6/2011 | Bourke, Jr. | H01L 31/055 136/253 |
| 2011/0155213 | A1* | 6/2011 | Yao | H01L 31/048 136/246 |
| 2011/0284729 | A1* | 11/2011 | Abouraddy | G01J 1/04 250/227.11 |
| 2013/0333755 | A1* | 12/2013 | Lunt | H01L 31/055 136/259 |
| 2014/0130864 | A1* | 5/2014 | Lunt | H01L 31/055 136/259 |
| 2014/0283896 | A1* | 9/2014 | Lunt, III | H01L 31/055 136/247 |
| 2016/0327714 | A1* | 11/2016 | Patrick | H01L 31/055 |

FOREIGN PATENT DOCUMENTS

| | | |
|---|---|---|
| JP | 2001297875 A * | 10/2001 |
| JP | 6073876 | 2/2017 |
| WO | 9904296 | 1/1999 |
| WO | 2008157621 | 12/2008 |

OTHER PUBLICATIONS

Extended European Search Report for Application No. 12807686.6 dated Jan. 13, 2015 (10 pages).
International Report on Patentability for International Application No. PCT/AU2012/00078 dated Jun. 28, 2013 (40 pages).
International Search Report for International Application No. PCT/AU2012/00078 completed Aug. 9, 2012 (3 pages).
Japanese Patent Office Action with English translation for Application No. 2017000785 dated Aug. 8, 2017 (8 pages).
Sumner et al., "Analysis of Optical Losses in High-Efficiency CuInS2-Based Nanocrystal Luminescent Solar Concentrators: Balancing Absorption versus Scattering," The Journal of Physical Chemistry C, 2017, 121, 3252-3260.
Vasiliev et al., "Photonic microstructures for energy-generating clear glass and net-zero energy buildings," Scientific Reports, 2016, 14 pages.

* cited by examiner

SPECTRALLY SELECTIVE PANEL

CROSS-REFERENCE TO RELATED APPLICATIONS

This application is a continuation of and claims priority to International Patent Application No. PCT/AU2012/000778 filed Jun. 29, 2012, the entire content of which is hereby fully incorporated by reference. This application also claims priority to Australian Patent Application Nos. 2011902631 filed Jul. 1, 2011, 2011904552 filed Nov. 2, 2011, 2012900381 filed Feb. 2, 2012, and 2012901618 filed Apr. 24, 2012, the entire content of each of which is hereby fully incorporated by reference.

FIELD OF THE INVENTION

The present invention relates to a spectrally selective panel and relates specifically, though not exclusively, to a panel that is transparent for visible light and deflects infrared light.

BACKGROUND OF THE INVENTION

Overheating of interior spaces, such as spaces that receive sunlight through large windows, is a problem that may be overcome using air conditioners. A large amount of energy is globally used to cool interior spaces. The majority of electrical energy is generated using non sustainable sources, which is of increasing environmental concern.

U.S. Pat. No. 6,285,495 (owned by the present applicant) discloses a material that may be used as a windowpane and that is largely transmissive for visible light, but diverts a portion of incident light to side portions of the panel where it is absorbed by photovoltaic cells to generate electricity. This material is of dual benefit: As the transmission of IR radiation is reduced, heating of interior spaces can be reduced and at the same time electrical energy can be generated.

SUMMARY OF THE INVENTION

The present invention provides in a first aspect a spectrally selective panel comprising:
- a first material being at least partially transmissive for light having a wavelength in the visible wavelength range and being arranged for guiding suitable light, the first material comprising a luminescent material that is arranged such that a portion of IR light is absorbed by the luminescent material resulting in emission of light by photoluminescence, fluorescence or phosphorescence;
- a diffractive element being positioned in, at or in the proximity of the first material, the diffractive element being arranged to deflect predominantly light having a wavelength in an IR wavelength band;
- wherein the first material is arranged and the diffractive element is oriented such that at least a portion of energy associated with IR light incident from a transversal direction of the spectrally selective panel is directed along the panel towards a side portion of the panel.

The spectrally selective panel in accordance with embodiments of the present invention may be regarded as an IR broadband heat shield for solar light and may be used for various purposes. For example, the spectrally selective panel may be provided in the form of, or may comprise, a windowpane of a building, car, boat or any other object that comprises windows or blinds. Further, the spectrally selective panel may form a covering of an object.

In a specific embodiment, the diffractive element is a grating such as a phase grating and may either be a reflection-mode or transmission-mode grating. The diffractive element may be a two-dimensional or a three-dimensional grating.

The diffractive element may have a grating period in the range of the IR wavelength band. For example, the grating period may be in the range of 1 μm to 10 μm, 2 μm to 6 μm, or approximately 4 μm.

Further, the diffractive element typically is arranged to allow maximized zero-order transmission of visible light.

Consequently, the diffractive element facilitates maintaining high visible-range transmission simultaneous with deflection of incident solar IR light that assists "trapping" of IR light within the panel by total internal reflection.

In one particular example, the diffractive element is partially or entirely composed of the first material.

The diffractive element may be attached or formed on any face of the spectrally selective panel or any of its constituent parts. For example, the diffractive element may be a grating that is etched into a face of the spectrally selective panel.

Alternatively, the grating may be formed form a material that is deposited onto a face of the spectrally selective panel portion.

Further, the grating may be embossed into a face of the spectrally selective panel portion or into a material that is deposited onto the spectrally selective panel portion, such as a polymeric material.

The diffractive element may also comprise a layered structure that is reflective for light having a wavelength in an IR wavelength band and may be transmissive for light having a wavelength in a visible light wavelength range. The diffractive element may be a one two or three dimensional grating having a grating structure that is etched or embossed into the layered structure.

In one specific embodiment, the diffractive element is sandwiched between portions of the spectrally selective panel.

In one example, the diffractive element comprises a plurality of grooves. The plurality of grooves may be at least partially filled with a material, for example, an epoxy, a scattering material or the luminescent material.

In an alternative embodiment the diffractive element is also a grating, but comprises a structure that has periodic refractive index variations without grooves.

The spectrally selective panel may also comprise a scattering material that is positioned in or at the first material. The scattering material typically is represented by nano- or micro-powders of high-refractive-index material which can also have photoluminescence properties due to either its own composition or any added activator dopants, and such powder(s) are typically incorporated into a surrounding matrix material, for example into a UV-curable liquid epoxy, and this scattering material can also be arranged to scatter light in a preferential direction. Both the weight % of the scattering powder concentration within the surrounding epoxy material and the characteristic powder particle size (and maybe particle shapes or crystallographic phase content types) are optimized to achieve maximized visible-range transparency together with the best possible IR light deflection/trapping capability.

There may be a plurality of these scatterer layers used within the panel structure.

The diffractive element may also be one of two or more diffractive elements.

The scattering material may comprise micro- or nano-sized particles and may be provided in the form of a film.

Dependent on an angle of incidence, the luminescent material further facilitates directing the IR light towards the side portion of the spectrally selective panel.

A portion of the scattering material may also be dispersed within the first panel portion. Scattering of light may be achieved in a substantially lossless manner within the IR and/or visible wavelength range if for example the scattering material comprises materials having wide band gaps, such as particles of rare earth oxides ($Yb_2O_3$ or $Nd_2O_3$ for example).

In one embodiment, the spectrally selective panel forms an IR specific visibly transmissive concentrator. Further, a portion of the IR light is directed to side portions of the panel where it may be used, for example, for generation of electrical energy using photovoltaic cells.

The spectrally selective panel may comprise component panel portions and the diffractive element and/or the scattering material may be sandwiched between adjacent ones of the component panel portions that are positioned in a face-to-face relationship. For example, the diffractive element may be included in a layer that is sandwiched between component panel portions and the layer may comprise the diffractive element at one side portion. Alternatively, the spectrally selective panel may comprise two diffractive elements that are included in a layer that is sandwiched between component panel portions and the layer may comprise the diffractive elements at respective side portions. In either case the layer may also function as an adhesive that couples the component panel portions to the layer.

The spectrally selective panel may also comprise a gap, such as an air- or a gas-filled gap between component panel portions, which may be spaced apart using suitable spacers. In one particular embodiment, the diffractive element and/or the scattering material is positioned in or at the gap. Surfaces of the component panel portions defining the gap may be coated with the scattering material and/or the luminescent material.

In one example, the diffractive element comprises a plurality of grooves and is positioned such that the plurality of grooves is located in the gap.

The spectrally selective panel typically also includes a reflective component, such as a reflective film, that is arranged to reflect incident light within an infrared (IR) wavelength band while being largely transmissive for at least the majority of light having a wavelength within the visible wavelength band. The spectrally selective panel may also be reflective for UV light.

The spectrally selective panel typically is arranged such that the reflective component, which typically is a reflective layer or a multilayer film, is positioned at a bottom portion of the spectrally selective panel (at or near the inside-facing window surface if used in window-type products) and the spectrally reflective component reflects a portion of IR light that is transmitted through the first panel portion.

Further, the spectrally selective panel may comprise a top layer on which light is incident prior to transmission through the first panel portion of the spectrally selective panel. The top layer typically is a multi-layered structure that is largely transmissive or even anti-reflective for visible light and arranged for reflecting a portion of IR light, such as IR light that is emitted by the luminescent material.

In one embodiment the luminescent material comprises visibly transparent luminophores that are arranged for absorption of IR light. The luminescent material may also be arranged such that a (small) portion of incident UV light (or a small fraction of the incident visible radiation) is absorbed by the luminescent material resulting in emission of luminescent light in random directions.

Further, the luminescent material may be arranged for emission of luminescent light by up and/or down-conversion of the frequency of the received light.

The luminescent material may comprise organic or inorganic dye molecules, laser dye molecules and/or metal oxide based luminescent materials such as suitable rare-earth oxide materials and may be located within the first panel portion and at a bottom or top side of the first panel portion of the panel. Alternatively, the luminescent material may be concentrated near a central region of the first panel portion. The luminescent material may also form a layer within or on the first panel portion. Alternatively or additionally, the luminescent material may be dispersed within the first or the second panel portion.

In one specific example the first panel portion comprises component panel portions that are arranged in a face-to-face relationship and the luminescent material is positioned between adjacent component panel portions.

In one specific embodiment the spectrally selective panel comprises at least one photovoltaic cell that is positioned at or near a side portion of the spectrally selective panel for receiving a portion of the IR and other light that is directed towards that side portion by the spectrally selective panel. For example, the at least one photovoltaic cell may be a Ge- or GaAs-based, or a CIGS (Copper Indium Gallium Diselenide), or CIS (Copper Indium Diselenide) photovoltaic cell that has a relatively small bandgap suitable for absorption of light in the IR wavelength range. Further, the at least one photovoltaic cell may comprise a stack of photovoltaic cells having multiple bandgaps.

The present invention provides in a second aspect a spectrally selective panel comprising:

a first material being at least partially transmissive for light having a wavelength in the visible wavelength range and being arranged for guiding suitable light;

a scattering material being positioned in or at the first material, the scattering material being arranged to scatter predominantly light having a wavelength in an IR wavelength band;

wherein the spectrally selective panel is arranged such that at least a portion of energy associated with IR light incident from a transversal direction of the spectrally selective panel is directed along the panel towards a side portion of the panel.

The invention will be more fully understood from the following description of specific embodiments of the invention. The description is provided with reference to the accompanying drawings.

DETAILED DESCRIPTION OF SPECIFIC EMBODIMENTS

Figure 1:
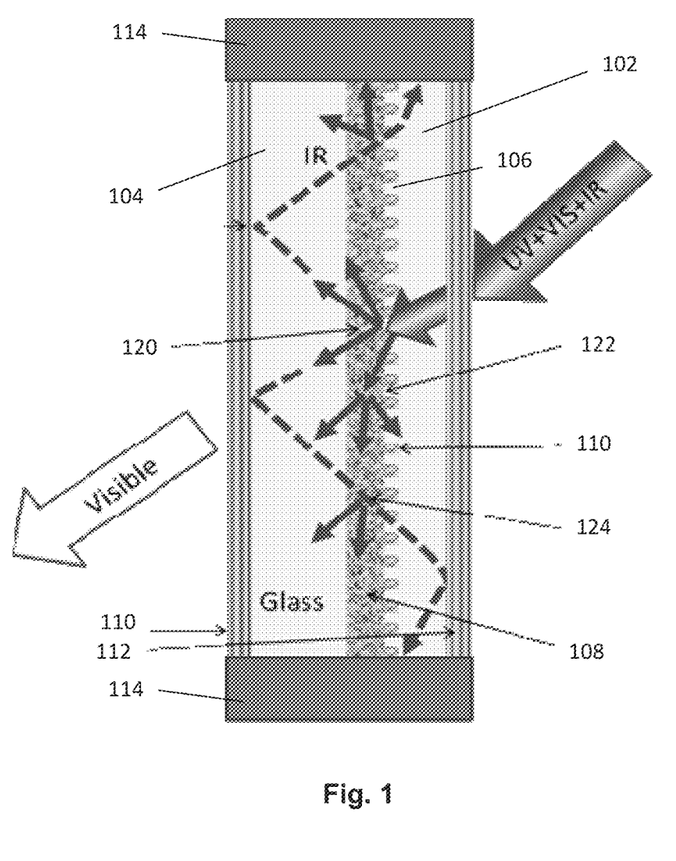
FIG. 1 is a representation of a spectrally selective panel in accordance with a specific embodiment of the present invention.

Referring initially to FIG. 1, a spectrally selective panel 100 is now described. The spectrally selective panel 100 may for example be provided in the form of a windowpane of a building, car, ship or any other suitable object. The spectrally selective panel reduces transmission of light having a wavelength in an IR wavelength band while being largely transmissive for visible light. The spectrally selective panel 100 is arranged to divert IR light and use the diverted IR light for generation of electrical energy.

The spectrally selective panel 100 comprises in this embodiment glass panels 102 and 104. A diffractive element 106 is provided on a face of the glass panel 102. The glass panels 102 and 104 are spaced apart by a gap filled with a material 108 that functions as an adhesive as well as transparent matrix into which the scattering and/or luminescent materials are incorporated thus making it a composite functional material. The material 108 will be described in more detail further below.

Exterior surfaces of the panels 102 and 104 are coated with multilayer coatings 112 and 110, respectively. Solar cells 114 are positioned at side portions of the spectrally selective panel 100. It is to be appreciated that the spectrally selective panel 100 may comprise any number of solar cells, such as only a single solar cell positioned at one side portion only, 2, 3 or 4 or more than 4 solar cells. A plurality of possible ways of electrically connecting these solar cells together can be utilized i.e series connections, all-in-parallel, and more complex series-connected parallel bundles of solar cells.

The diffractive element 106 is arranged for spectrally deflecting of incident and reflected IR light, and for transmission of visible light. Deflection of incident IR light is schematically shown by arrows 120. In this particular example, the diffractive element 106 is a transmission-mode blazed diffraction grating and is designed such that the majority of the incident solar IR light is deflected into a single preferential order of diffraction, with the grating design features optimized for the light incidence angle that is governed by the expected typical mid-day solar radiation incidence angle onto window surfaces. A person skilled in the art will appreciate that the diffractive element 106 can also be operated in reflection-mode.

In this particular embodiment, the diffractive element 106 is formed on a face of the glass panel 102, for example by etching. Consequently, the diffractive element 106 is also composed of glass, or alternatively a transparent film layer (like $SiO_2$) can be deposited onto a glass substrate and then this film layer can be etched or processed mechanically to form a diffractive structure. However, a person skilled in the art will appreciate that other arrangements are envisaged. For example the diffractive element 106 may be formed by embossing a grating structure into a polymeric material. In this case the grating 106 may be formed at a remote location and then adhered to the glass panel 102. Alternatively, the grating 106 may be formed on the glass panel 102 by initially applying a polymeric material (or another suitable material) to a face of the glass panel 102.

In one example the spectrally selective panel comprises a layer (not shown) that may comprise a polyvinyl butyral (PVB) and that is sandwiched between two glass panels. The layer comprises in this example luminescent and scattering materials. One diffractive grating is embossed into each face of the layer and the layer is then adhered to the glass panels at the gratings such grooves of the gratings are closed by surface portions of the glass panels. The layer typically also functions as an adhesive for coupling to the glass panels.

Spectral properties of the diffractive element 106 can be designed by those skilled in the art by adjusting the following parameters: refractive index, grating profile shape, blaze angle, duty cycle, grating period, number of phase levels and etching depth(s). In this particular example, the diffractive optical element 106 comprises a plurality of grooves 116, each groove having a distance in the range of 4 µm to an adjacent groove (grating period).

The plurality of grooves 116 and the gap between the glass panels 102, 104 are filled with the material 108. The material 108 is a luminescent scattering powder comprising an epoxy. The material 108 provides adhesive, luminescence and also scattering functions.

The scattering of incident light by the luminescent scattering powder increases a portion of the light that is directed towards side portions of the panel 100. This function is schematically indicated by arrows 122.

Light that is incident from a transversal direction of the spectrally selective panel may be absorbed by the luminescent material resulting in emission of luminescence radiation that is emitted in random directions which is schematically shown by arrows 124. This results in radiation that is less transversely oriented than the incident radiation and consequently facilitates direction of light towards side portions of the glass panels 102 and 104 towards the solar cells 114 for generation of electrical energy.

A person skilled in the art will appreciate that the glass panels 102 and 104 may also be doped with luminescent materials that absorb a portion of the incoming IR and UV light and emit luminescent radiation in random directions.

The coating 110 is a multilayer coating and is arranged to reflect incident IR light within a wide IR wavelength band.

Further, the multilayer coating 110 is anti-reflective for visible light and reflective for incident UV light. Consequently, a portion of IR and UV light that is incident from a top portion of the spectrally selective panel 100 is transmitted through the glass panels 102 and 104 and then reflected by the multilayer coating 110. The glass panels 102 and 104 are arranged such that, dependent on the angle of reflection, a portion of the reflected light is guided along the glass panels 102 and 104 towards solar cells 114, where the IR light can be absorbed for generating electrical energy.

A portion of IR light that is reflected by the layer 110 in a transversal direction is scattered by the layers 108 such that corresponding light intensity is directed by multiple scattering and/or internal reflection towards the solar cells 114. Consequently, the scattering properties of the layers 108 facilitate reduction of throughput of IR radiation and efficiency of energy generation.

The top coating 112 can have either the anti-reflective properties in the UV and visible wavelength ranges—in order to use as much incident UV energy within the panel structure as is available, and therefore excite a range of inorganic luminophores, or alternatively it can have high-reflection properties in the UV and also anti-reflection properties across the visible wavelength range and at the same time functions as a partial IR reflector. The visible-range antireflection properties can also be adjusted by design to minimize reflection of the incident light energy within a particular range of incidence angles. In another embodiment, the top coating 112 is arranged to be highly-reflective for the UV radiation whilst being antireflective for the visible light and optionally also highly-reflective within an IR wavelength (sub)-band within which the luminophore materials emit light. The high-reflectivity property in the UV band is in this example used to protect the luminophores from being adversely affected by the incident UV radiation. This coating is a multi-layered structure that is designed to reflect IR light predominantly within the wavelength range at which the luminescent material emits light. Consequently, the coating 112 largely prevents that generated luminescent radiation escapes without being directed to the photovoltaic cells 114.

The function of the spectrally selective panel 100 may be summarised as follows. After deflection by the diffractive element 106 and multiple scattering events through the material 108, an increased portion of the photons will propagate at angles exceeding the total internal reflection angle. Considering that a large fraction of the solar IR light is incident at large angles (facilitated by scattering and emission of luminescence radiation), a large portion of this IR light will be trapped within the spectrally selective panel 100 and will reach the side portions of the panel 100. The top coating 112 is designed to reflect the light emitted by the luminophores and is visibly transparent. The bottom coating 110 reflects the vast majority of IR light at all angles and wavelengths. These properties combined with the angular redistribution of the incoming photons by deflection and multi-pass scattering is a unique feature of the spectrally selective panels 100 in accordance with embodiments of the present invention.

It is to be appreciated that in an alternative embodiment the spectrally selective panel 100 may not necessarily comprise photovoltaic cells 114, but may for example comprise vents or the like that are arranged for removal of thermal energy that is directed in the form of IR radiation to side portions of the spectrally selective panel 100. Some of the side portions may also be coated by highly-reflective materials including Al or Ag or any suitable dielectric coatings which will re-direct the light away from such side surfaces towards other side-surfaces of the panel.

Figure 2:
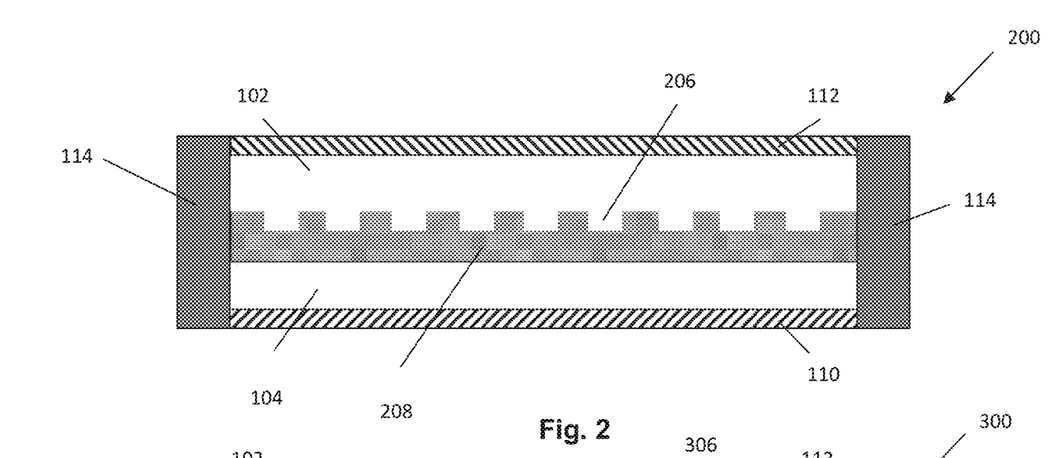
FIG. 2 is a representation of a spectrally selective panel in accordance with a further specific embodiment of a present invention.
Figure 3:
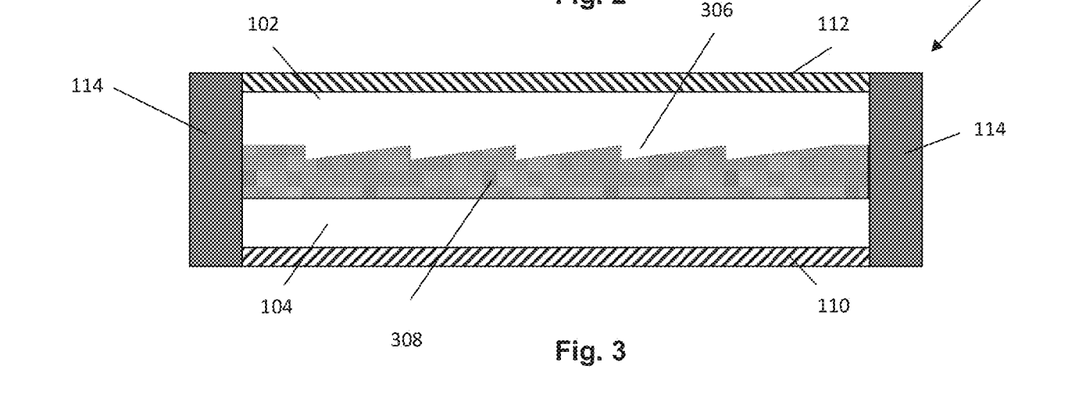
FIG. 3 shows a further schematic representation of a spectrally selective panel in accordance with a further embodiment of the present invention.

Referring now to FIGS. 2 and 3, diffractive elements 206, 306 of spectrally selective panels 200, 300 in accordance with further embodiments of the present invention are now described.

The diffractive element 206 is formed on a face of the glass panel 102 and is a transmission-mode blazed diffraction grating or a grooved diffraction grating of a different profile type (sawtooth, rectangular or trapezoidal).

In this particular example, the diffractive element 206 comprises a plurality of grooves wherein each groove has a rectangular cross-sectional shape.

The glass panels 102 and 104 are spaced apart by a gap filled with a material 208. The material 208 is composed of an optical epoxy in which luminescent scattering powders and pigments are dispersed. The epoxy couples the glass panel 104 to the glass panel 102. The material 208 further has luminescence and scattering properties.

FIG. 3 shows a spectrally selective panel 300 comprising the diffractive element 306. In this embodiment, the diffractive element 306 also comprises grooves, but each groove has a triangular cross-sectional shape.

Similar to the spectrally selective panel 200, the glass panels 102 and 104 are spaced apart by a gap that is filled with a material 308 being composed of an epoxy in which luminescent powders and pigments are dispersed or dissolved.

Figure 4:
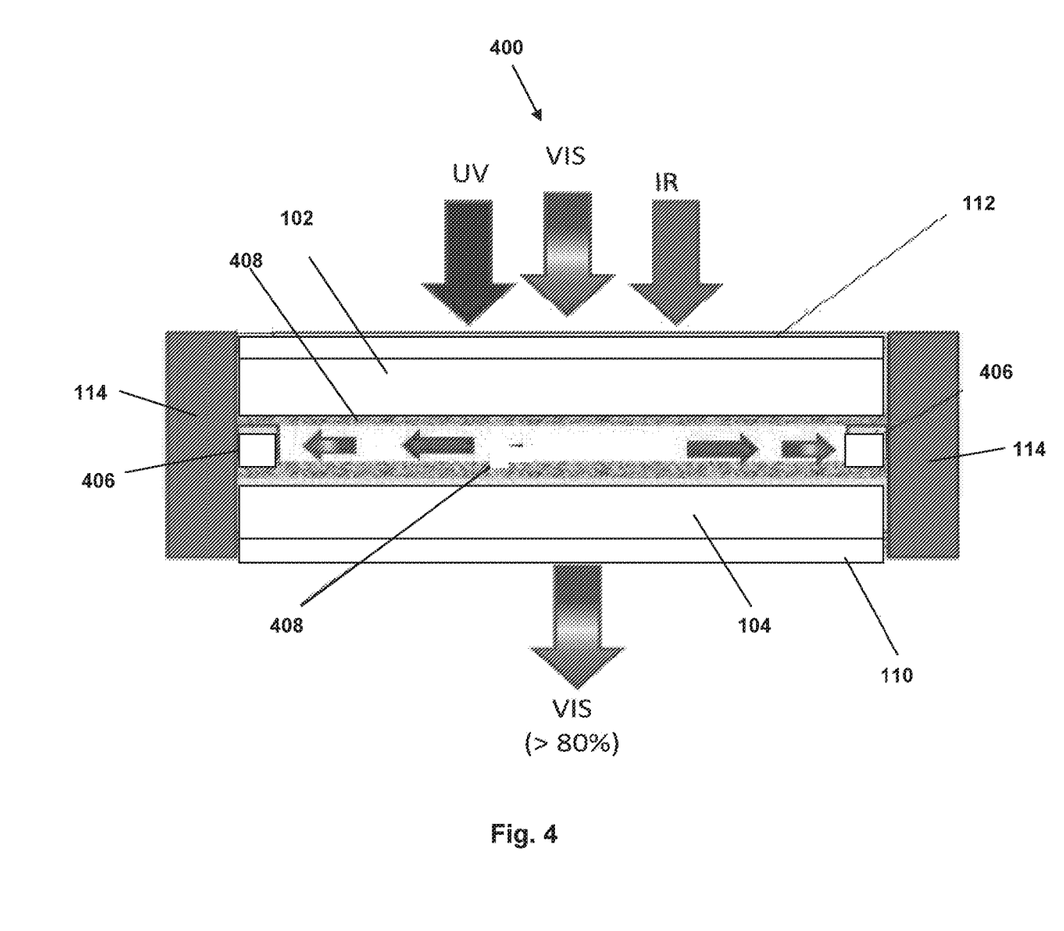
FIG. 4 shows a spectrally selective panel in accordance with an alternative embodiment of the present invention.

Referring now to FIG. 4, a spectrally selective panel 400 in accordance with another embodiment of the invention is now described.

In this embodiment the gap between the glass panels 102 and 104 is filled with air. Similar to a double-glazing window structure, the gap provides thermal insulation, improved overall-structural stability, noise insulation and additional high-index-contrast interfaces which lead to improving the light trapping probability on multiple reflections within the glass panels due to total internal reflections.

It is to be appreciated that in alternative embodiments that gap may be filled with any other suitable dielectric material. It will also be appreciated that in variations of the described embodiment the spectrally selective panel 100 may comprise any number of glass panels that may or may not define gaps between adjacent glass panels. Further, the glass panel or glass panels may be replaced by panel(s) of a suitable other material, such as a polymeric material including for example polyvinyl butyral (PVB) or polyvinyl chloride (PVC) and may also be provided in the form of a laminate such as a safety glass.

The interior surfaces of the glass panels 102 and 104 are coated with a coating 408. The glass panels 102 and 104 are spaced apart by transparent glass spacer 406.

Coatings 408 each comprise in this example a multi-layered structure that is arranged for preferential scattering of IR light in a direction towards side portions of the panel 400. In this embodiment the coatings 408 comprise nano- or micro-sized rare earth oxide particles having a relatively wide band gap such that the scattering is effectively lossless (non-absorbing). Further, the coatings (or layers) 408 may comprise an epoxy that couples the glass panels 102 and 104 to the spacers 406.

The layers 408 also comprise luminescent materials and the above-mentioned rare earth oxides are doped to have that function. For example, if light is incident from a transversal direction of the spectrally selective panel and then absorbed by the luminescent material, the subsequently emitted luminescent radiation is emitted in random directions. This results in radiation that is less transversely oriented and a portion of the luminescent radiation will be emitted in directions such that the glass panels 102 and 104 will guide the luminescent radiation towards the solar cells 114 for generation of electrical energy.

The glass panels 102 and 104 may also be doped with luminescent materials that absorb a portion of the incoming IR and UV light and emit luminescent radiation in random directions, but in a spatially-isotropic fashion.

A portion of IR light that is reflected by the layer 110 in a transversal direction is scattered by the layers 408 such that corresponding light intensity is directed by multiple scattering and/or internal reflection towards the solar cells 114. Consequently, the scattering properties of the layers 408 facilitate reduction of throughput of IR radiation and efficiency of energy generation.

In this embodiment the gap between the glass panels 102 and 104 is filled with air. However, a person skilled in the art will appreciate that the gap may be filled with any other suitable dielectric material.

The luminescence material, in this example included provided in the layer 408, is located at top and bottom faces of the glass panels 102 and 104, respectively. Alternatively, the luminescent material may be positioned at only one of the glass panels 102 and 104 may be doped with, or may comprise, the luminescent material.

Figure 5:
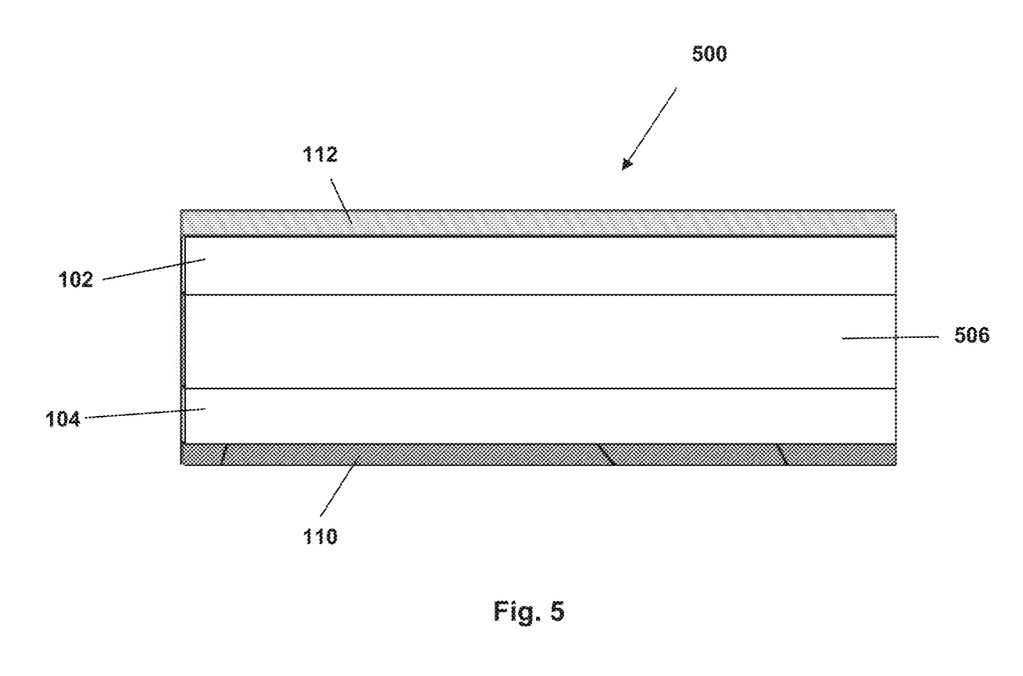
FIG. 5 illustrates a schematic representation of a further embodiment of the present invention.

Referring now to FIG. 5, a spectrally selective panel 500 in accordance with a further embodiment of the present invention is now described. The luminescent scattering powder comprises a single material that is a composition and that provides luminescence and also the scattering functions. Alternatively, the luminescent scattering power may be a mixture of component materials and each component material may have a respective function. The spectrally selective panel 500 comprises glass panels 102 and 104. In this embodiment, the glass panels are spaced apart by a layer 506 comprising an optical epoxy in which luminescent scattering powders and pigments are dispersed. Alternatively, the layer 506 may comprise a suspension or solution that includes the scattering material and/or the luminescent material. Consequently, the layer 506 combines the functions of coupling the glass panels 102 and 104 to each other, providing a luminescent material and acting as scattering layers.

The scattering layers of the spectrally selective panels 400 and 500 were formed using RF sputtering and comprise rare earth oxides. The scattering layers may be included, or provided instead of, the above-described layers 408 and 506. These rare earth oxide layers are prepared such that they have preferential scattering/diffusing properties in the IR wavelength range and have an amorphous surface covering (formed by an oven annealing process), which is responsible for the preferential scattering in the IR wavelength range. These microcrystalline rare-earth oxide layers, which may comprise for example an $Yb_2O_3$ layer, have a thickness 700-1500 nm and are deposited on glass using RF magnetron sputtering in pure Ar atmosphere and post-deposition re-oxidized and annealed (crystallized) by oven processing for 3 hrs at a temperature of 600° C. in air).

The scattering layers 408 and 506 combine scattering functions, such as optically-lossless scattering, with luminescent energy-conversion functions. The layers 408 and 506 have a thickness of a few 100 nm and comprise nano- or micro-sized particles of rare earth materials (such as $Yb_2O_3$, $Nd_2O_3$) that have wide bandgaps within their electronic energy-level structures and enable essentially lossless light scattering in the IR and also visible wavelength ranges. The rare earth particles are linked by optically-transparent UV-curable epoxies (such as Norland NOA63 epoxy). Further, luminophores (pigments and nano-powdered materials) are dispersed within the epoxy material of the layers 408 and 506. In one example IR-excitable hybrid organic-inorganic luminophores are dispersed in the epoxy at a concentration of approximately around 0.25-1 wt %.

The rare earth oxides may also be doped with rare earth luminescent materials represented for example by rare-earth metal ions, and may for example be provided in the form of $Y_2O_3$:Eu, $Y_2O_3$:Er or $NaYF_4$:Yb.

The spectrally selective panel 400 and 500 typically also comprise a diffractive elements (not shown), such as diffractive element 106 described with reference to FIG. 1.

The IR reflective layer 110 of the spectrally selective panels in accordance with embodiments as, for example, shown in FIGS. 1 to 5, will now be described in further detail.

The layer 110 is provided in the form of multilayer optical interference coating filters that have ultra-broadband heatmirror properties and use a triple-stack edge-filter design. The layer 110 is also reflective in the UV range. The layer 110 is formed from $Al_2O_3$, $SiO_2$ and $Ta_2O_5$ using RF sputtering techniques. The total thickness of such a coating is in these embodiments between 4-8 μm and the order of optical materials within a sequence of layers may vary, depending on a chosen design. Annealing experiments (3 hrs at 600° C. with temperature ramp-rates of 5° C./min) demonstrated excellent stability. The layer 110 is scratch- and crack-resistant, heat-resistant, non-hygroscopic and stable with respect to the action of common chemical solvent types.

The performance characteristics of the coating 110 on glass were tested and modelled. Results indicated that the fraction of total integrated solar-IR light power contained within the wavelength range of 700-1700 nm and that transmits optically through the substrate-coating system is only approximately 4%. Since the coating 110 has ultrawideband properties, IR power reflectivity is efficient for a wide range of incident angles.

As indicated above, the top coating 112 is provided in the form of spectrally selective emission mirrors. The coating 110 comprises multiple layers (20-25) of $Al_2O_3$, $SiO_2$ and $Ta_2O_5$ and is prepared using RF sputtering techniques. In these embodiments, the layer 112 is designed such that especially luminescent radiation that is generated within the spectrally selective panel is prevented from transmission through the coating 112 by reflection. The thickness of such coatings varies with design requirements and is in the range of several μm.

Figure 6:
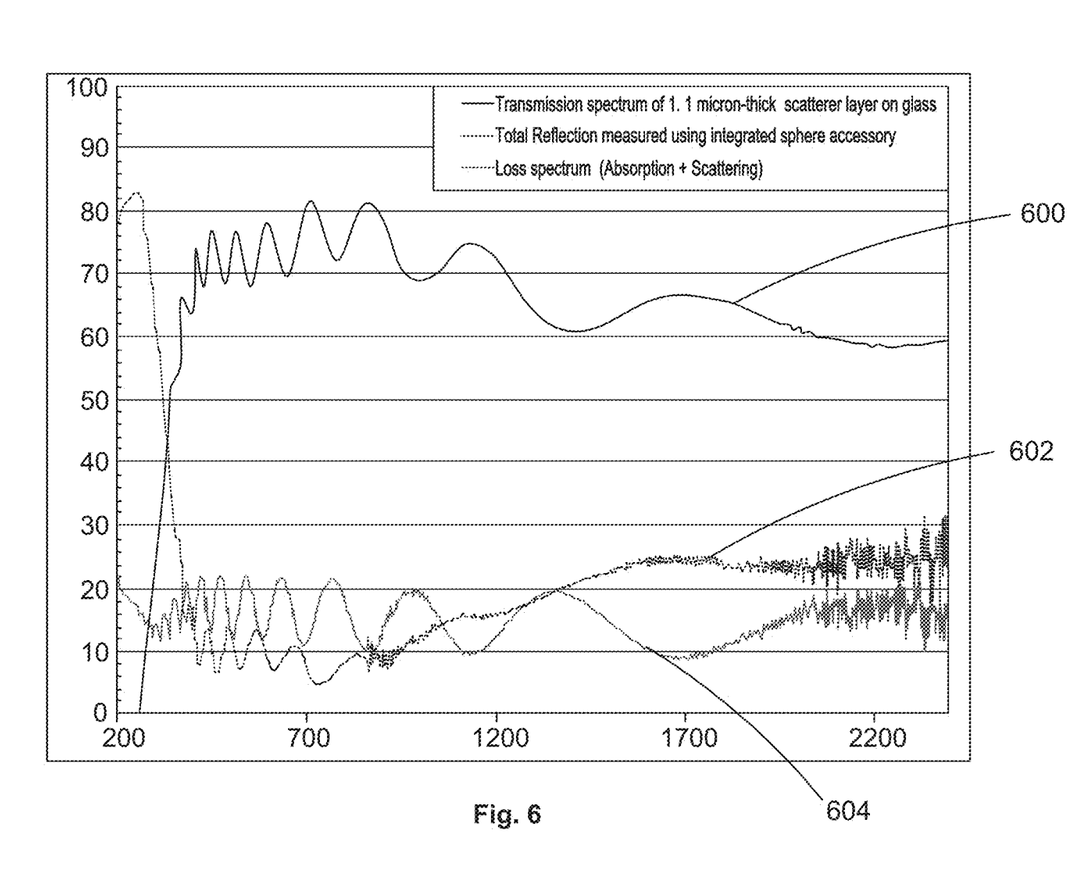
FIGS. 6 and 7 show results of measurements that were taken using components in accordance with specific embodiments of the present invention.

FIG. 6 shows transmission and absorption spectra of such a rare earth oxide layer on glass (intensity as a function of wavelength in nm) as, for example, described for the embodiments shown in FIGS. 4 and 5. Plot 600 shows that transmission spectrum for a scatter layer having a thickness of around 1 μm, plot 602 shows total (specular and diffused) reflection and plot 604 shows the corresponding optical-loss spectrum (represented by the sum of absorption and scattering transmission-loss and reflection-loss contributions). The layer showed preferential scattering within the IR spectral range which covered most of near IR range. The visible transparency was near 80%. After being brought into contact with an optical epoxy of refractive index close to 1.49 (matched to glass), the scattering reduces and transparency improves. This rare earth oxide scatterer layer has luminophore properties when excited by suitable light.

Figure 7:
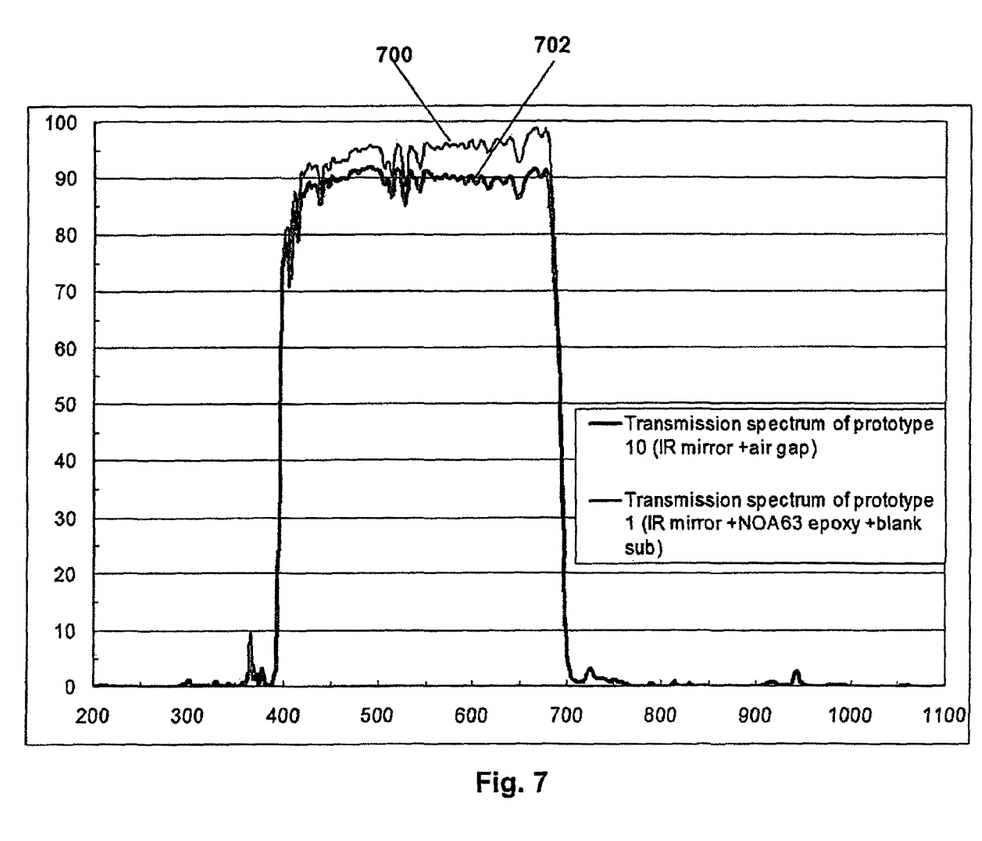

FIG. 7 shows transmission spectra for the spectrally selective panels 400 and 500 (transmitted fraction of intensity as a function of wavelength in nm). Plot 700 shows the measured transmission data for a panel of the type of the spectrally selective panel 400 (with air gap) and plot 702 shows the measured transmission data for a panel of the type of the spectrally selective panel 500 (no air gap).

It is worth noting the air gap of the panel 400 does not significantly affect the visible transmission. Further, as the epoxy is index-matched to glass, the epoxy itself does not cause any significant transmission loss.

The function of the spectrally selective panel 400 may be summarised as follows. After multiple scattering passes through scattering layers and interfaces, (statistically) more photons will propagate at angles exceeding the total internal reflection angle for light rays propagating within a glass panel surrounded by air. Considering that a large fraction of the solar IR light is incident at large angles (facilitated by scattering and emission of luminescence radiation), a large fraction of this IR light will be trapped within the spectrally selective panel 400 and will reach the side portions of the panel 400. The top coating 112 is designed to reflect the light emitted by the luminophores and is visibly transparent. In some implementations, the spectral features of this coating can be used to provide intended visible coloration for the panel in a range of colours to suit different product types. The bottom coating 110 reflects the vast majority of IR light at all angles and wavelengths. These properties combined with the angular redistribution of the incoming photons by multi-pass scattering within relatively thin non-absorbing or weakly-absorbing and luminescent layers 408 is a unique feature of the spectrally selective panels 400 in accordance with embodiments of the present invention. The scattering effects are also capable of enhancing the luminescence processes by improving the luminophore absorption path lengths.

Although the invention has been described with reference to particular examples, it will be appreciated by those skilled in the art that the invention may be embodied in many other forms. For example, the spectrally selective panels 100 and 200 comprise reflective top and bottom coatings 112, 110 and 210, 208, respectively. It will be appreciated that in variations of the described embodiments the spectrally selective panels 100 and 200 may not comprise such reflective top and bottom coatings.

The invention claimed is:

1. A spectrally selective panel comprising:
a first material being transmissive for light having a wavelength in the visible wavelength range and being arranged for guiding light, the first material comprising a luminescent material that is arranged such that a portion of IR light is absorbed by the luminescent material resulting in emission of light by photoluminescence, fluorescence or phosphorescence, and the first material comprising a scattering material, the scattering material comprising nano- or micro-sized particles;
a transmission-mode phase grating positioned at or within the first material, the phase grating being arranged to deflect light having a wavelength in an IR wavelength band and having a plurality of grooves that are at least partially filled with the scattering material and the luminescent material; and
a reflective film that is arranged to reflect incident light within an IR wavelength band while being transmissive for the visible wavelength range of light,
wherein the first material, the phase grating and the reflective film are arranged such that at least a portion of energy associated with IR light incident from a transversal direction of the spectrally selective panel is guided within and along the panel towards a side portion of the panel, and
wherein the phase grating is configured to maintain zero-order transmission of visible light and simultaneously deflect incident IR light.

2. The spectrally selective panel of claim 1 comprising at least one photovoltaic cell that is positioned at or near the side portion of the spectrally selective panel for receiving light that is directed towards the side portion.

3. The spectrally selective panel of claim 1 wherein the phase grating is partially composed of the first material.

4. The spectrally selective panel of claim 1 wherein the phase grating has a grating period in the range of 2 µm to 6 µm.

5. The spectrally selective panel of claim 1 wherein the phase grating is sandwiched between portions of the spectrally selective panel.

6. The spectrally selective panel of claim 1 wherein the scattering material is positioned in the first material.

7. The spectrally selective panel of claim 1 wherein the phase grating is included in a layer that is sandwiched between component panel portions and wherein the layer comprises the phase grating at one side portion.

8. The spectrally selective panel of claim 1 comprising at least two phase gratings that are included in a layer that is sandwiched between component panel portions and wherein the layer comprises the phase grating at respective side portions.

9. The spectrally selective panel of claim 7 wherein the layer also functions as an adhesive that couples component panel portions to the layer.

10. The spectrally selective panel of claim 1 wherein the scattering of light is achieved in a substantially lossless manner within the IR and/or visible wavelength range and wherein the scattering material comprises rare earth oxide particles.

11. The spectrally selective panel of claim 1 comprising a gap between panel portions.

12. The spectrally selective panel of claim 11 wherein the gap is air-filled.

13. The spectrally selective panel of claim 11 wherein the phase grating is positioned in or at the gap.

14. The spectrally selective panel of claim 13 wherein the phase grating is positioned such that the plurality of grooves is located in the gap.

15. The spectrally selective panel of claim 1 comprising a top layer on which light is incident prior to transmission through a portion of the spectrally selective panel.

16. The spectrally selective component of claim 15 wherein the top layer is a multi-layered structure that is largely transmissive or even anti-reflective for visible light and arranged for reflecting a portion of IR light.

17. The spectrally selective panel of claim 1 wherein the luminescent material comprises visibly transparent luminophores that are arranged for absorption of IR light.

18. The spectrally selective panel of claim 1 wherein the luminescent material is arranged for emission of luminescent light by up and/or down-conversion of the frequency of the received light.

* * * * *